:::

United States Patent
Russ et al.

(10) Patent No.: US 7,732,834 B2
(45) Date of Patent: Jun. 8, 2010

(54) SEMICONDUCTOR ESD DEVICE AND METHOD OF MAKING SAME

(75) Inventors: Cornelius Christian Russ, Diedorf (DE); Kai Esmark, Neuried (DE); David Alvarez, Essex, VT (US); Jens Schneider, München (DE)

(73) Assignee: Infineon Technologies AG, Munich (DE)

( * ) Notice: Subject to any disclaimer, the term of this patent is extended or adjusted under 35 U.S.C. 154(b) by 439 days.

(21) Appl. No.: 11/698,674

(22) Filed: Jan. 26, 2007

(65) Prior Publication Data

US 2008/0179624 A1 Jul. 31, 2008

(51) Int. Cl.
    *H01L 29/74* (2006.01)
(52) U.S. Cl. .............. 257/173; 257/107; 257/E29.211
(58) Field of Classification Search ............ 257/107, 257/173, E29.211
    See application file for complete search history.

(56) References Cited

U.S. PATENT DOCUMENTS

| | | | |
|---|---|---|---|
| 5,274,262 A | 12/1993 | Avery | |
| 5,343,053 A | 8/1994 | Avery | |
| 5,374,565 A | 12/1994 | Hsue et al. | |
| 6,791,122 B2 | 9/2004 | Avery et al. | |
| 2002/0041007 A1 | 4/2002 | Russ | |
| 2002/0053704 A1 | 5/2002 | Avery et al. | |
| 2005/0195540 A1 | 9/2005 | Streibl et al. | |
| 2006/0097321 A1* | 5/2006 | Kim ............................ | 257/355 |
| 2006/0151836 A1* | 7/2006 | Salcedo et al. ............... | 257/362 |
| 2006/0152868 A1* | 7/2006 | Ker et al. ..................... | 361/56 |
| 2006/0267044 A1* | 11/2006 | Yang ............................ | 257/141 |
| 2007/0085142 A1* | 4/2007 | Manna et al. ................ | 257/360 |

FOREIGN PATENT DOCUMENTS

EP    1 294 .025 A2    3/2003

OTHER PUBLICATIONS

Mergens, M., et al., "Speed Optimized Diode-Triggered SCR (DTSCR) for RF ESD Protection of Ultra-Sensitive IC Nodes in Advanced Technologies," IEEE Transactions on Device and Materials Reliability, Sep. 2005, pp. 532-542, vol. 5, No. 3.
Mergens, M., et al., "Advanced SCR ESD Protection Circuits for CMOS / SOI Nanotechnologies," IEEE 2005 Custom Integrated Circuits Conference, 2005, pp. 481-488.

* cited by examiner

*Primary Examiner*—Victor A Mandala
(74) *Attorney, Agent, or Firm*—Slater & Matsil, L.L.P.

(57) ABSTRACT

A semiconductor device includes an ESD device region disposed within a semiconductor body of a first semiconductor type, an isolation region surrounding the ESD device region, a first doped region of a second conductivity type disposed at a surface of the semiconductor body within the ESD region, and a second doped region of the first conductivity type disposed between the semiconductor body within the ESD region and at least a portion of the first doped region, where the doping concentration of the second doped region is higher than the semiconductor body. A third doped region of the second semiconductor type is disposed on the semiconductor body and a fourth region of the first conductivity type is disposed over the third doped region. A fifth doped region of the second conductivity type is disposed on the semiconductor body. A trigger device and an SCR is formed therefrom.

32 Claims, 9 Drawing Sheets

SEMICONDUCTOR ESD DEVICE AND METHOD OF MAKING SAME

TECHNICAL FIELD

This invention relates generally to semiconductor devices and methods, and more particularly to an ESD protection device and method.

BACKGROUND

As electronic components are getting smaller and smaller along with the internal structures in integrated circuits, it is getting easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry.

Device failures that result from ESD events are not always immediately catastrophic or apparent. Often, the device is only slightly weakened but is less able to withstand normal operating stresses and, hence, may result in a reliability problem. Therefore, various ESD protection circuits should be included in the device to protect the various components.

When an ESD pulse occurs on a transistor, the extremely high voltage of the ESD pulse can break down the transistor and can potentially cause permanent damage. Consequently, the circuits associated with the input/output pads of an integrated circuit need to be protected from ESD pulses so that they are not damaged.

Integrated circuits and the geometry of the transistors which make up the integrated circuits continue to be reduced in size and the transistors are arranged closer together. A transistor's physical size limits the voltage that the transistor can withstand without being damaged. Thus, breakdown voltages of transistors are lowered and currents capable of overheating components are more frequently reached by the voltages and currents induced by an ESD event. Additionally, recent advances in technology have produced devices which can fail at voltage levels lower than the triggering voltages of known ESD protection circuits. Thus, there is a need for small, compact ESD protection circuits with lower triggering voltages.

SUMMARY OF THE INVENTION

In one embodiment, a semiconductor device includes an ESD device region disposed within a semiconductor body of a first semiconductor type, an isolation region that surrounds the ESD device region, first doped region of a second conductivity type disposed at a surface of the semiconductor body within the ESD region, where the second conductivity type is different from the first conductivity type. Also included is a second doped region of the first conductivity type disposed between the semiconductor body within the ESD region and at least a portion of the first doped region, where the second doped region is doped at a higher concentration than the semiconductor body. Disposed on the semiconductor body is a third doped region of the second semiconductor type, and disposed over the third doped region is a fourth doped region of the first conductivity type, where the edge of the third doped region is a first distance away from the edge of the fourth doped region. A fifth doped region of the second conductivity type disposed on the semiconductor body a second distance from the third doped region. The first, second, and fifth doped regions and the semiconductor body within the ESD region form a trigger device, and the third, fourth and fifth regions, and the semiconductor body within the ESD region form an SCR.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a silicon controlled rectifier (SCR) ESD structure with an NPN trigger. The invention may also be applied, however, to other semiconductor structures.

Figure 1A:
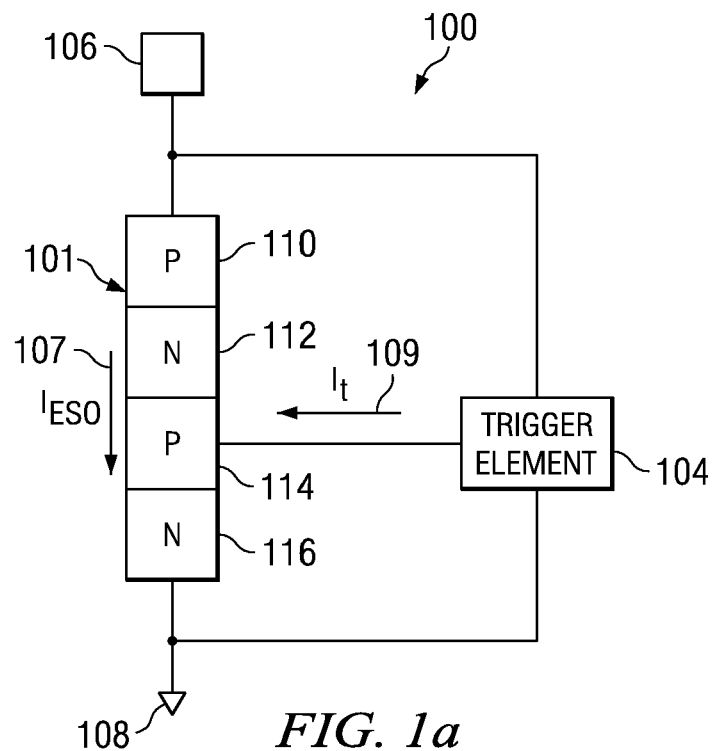
FIGS. 1a-1c are circuit diagrams of an embodiment of the present invention.

FIG. 1a illustrates a known ESD protection device 100. This circuit includes an SCR 101 which includes a p-type anode 110, an n-type cathode 116, an n-type n-base SCR region 112, and a p-type p-base SCR region 114. The anode 110 and a trigger element 104 are coupled to a node to be protected 106 and a reference node 108, which is typically ground. The trigger element 104 causes a trigger current $I_t$ 109 to flow whenever the voltage at node 106 exceeds a certain threshold. Typical required trigger thresholds are between 2V and 20V. The presence of a trigger current $I_t$ 109 causes the SCR to conduct a large current, $I_{ESD}$ 107.

Figure 1B:
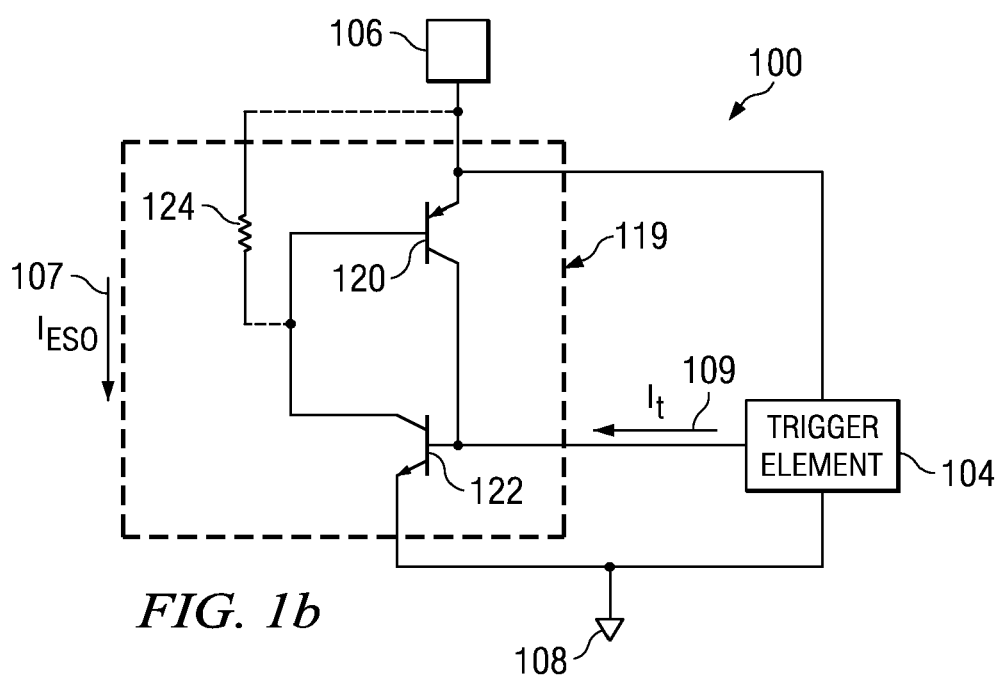

FIG. 1b is an equivalent circuit representation of the ESD protection device in a non-conducting state where the voltage at node 106 is less than the threshold of the trigger device, and the SCR is not conducting a large current $I_{ESD}$ 107. In the non-conducting state, the SCR can be modeled as a bipolar latch 119 which includes a BJT PNP device 120, and a BJT NPN device 122. The representative PNP device is made up of the p-type anode 110 as the emitter, the n-base region 112 as the base, and p-base region 114 as the collector. The representative NPN device is made up of n-base region 112 as the collector, the p-base region 114 as the base, and the n-type cathode 116 as the emitter. When trigger current $I_t$ 109 flows into the base of representative NPN 122 in response to a voltage transient at node 106, the collector of the representative NPN 122 is pulled low, which turns on PNP 120, which pulls the base of NPN 122 up toward the potential at node 106, thereby latching the bipolar latch 119 and causing a large current $I_{ESD}$ 107 to flow. An optional Resistance 124 can be added to the circuit to adjust the trigger level by bleeding away base current from PNP 120, thereby requiring a higher trigger current to activate the bipolar latch 119.

Figure 1C:
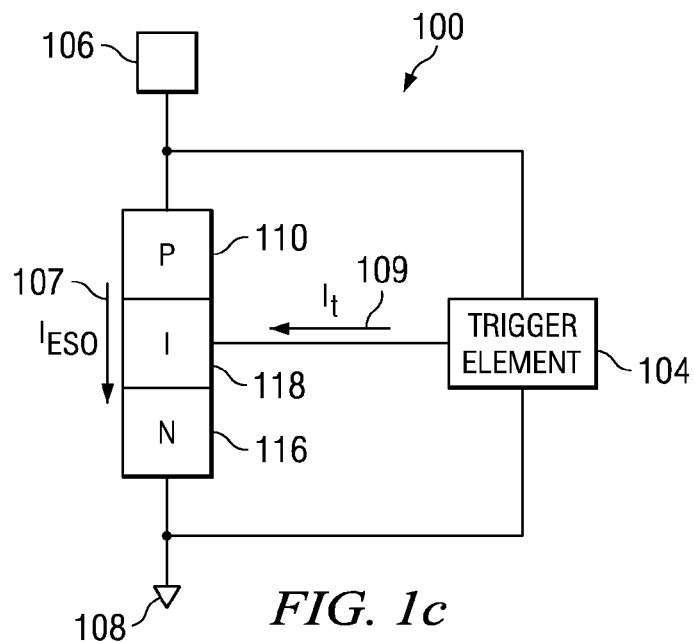

Turning to FIG. 1c once the SCR 101 is latched, the SCR can be modeled as a forward biased PIN diode where the intrinsic region 118 includes the n-base region 112 and the p-base region 114 in avalanche breakdown. When the SCR 101 is turned on $I_{ESD}$ 107 will continue to flow even if $I_t$ 109 is no longer applied. An SCR fabricated in a submicron process will typically conduct 10 mA to 100 mA per µm width. The SCR will stop conduction once $I_{ESD}$ 107 falls below a holding current, typically 1 µA to 1 mA of per µm width.

Figure 2:
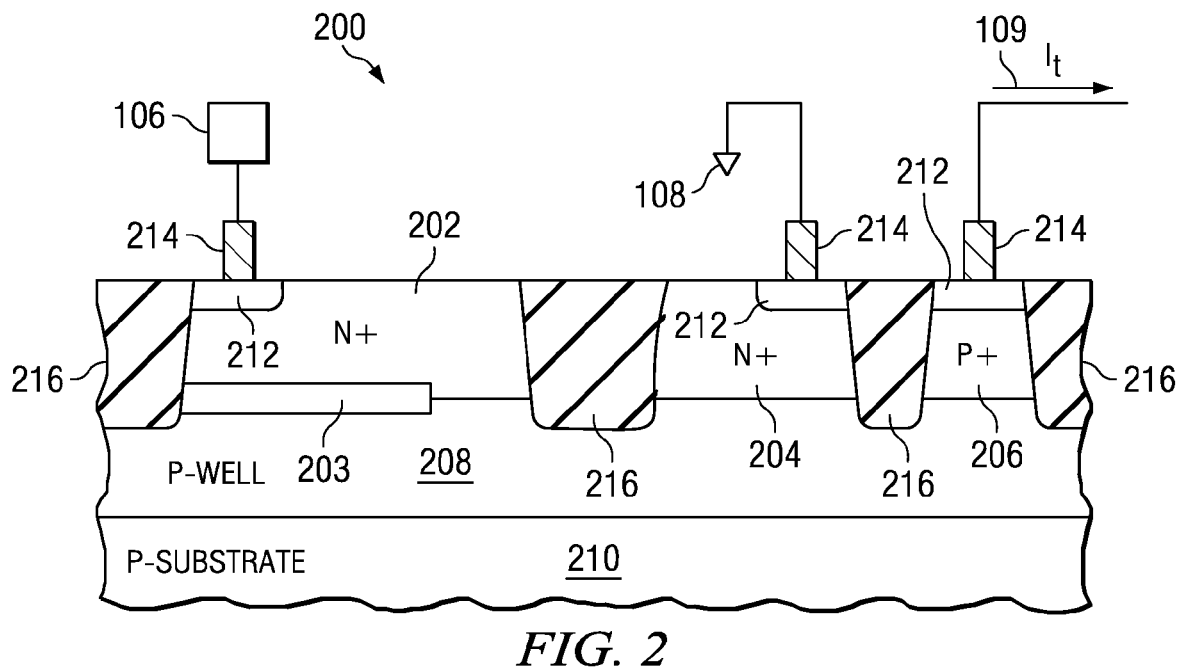
FIG. 2 is a cross-section of an NPN transistor used in embodiments of the present invention.

FIG. 2 illustrates a cross-section of the NPN triggering element 104 of an embodiment of the present invention. The NPN triggering element 104 is fabricated as a lateral NPN which includes an n-type collector 202, an n-type emitter 204, a p-type base region 208, and a p-type base contact region 206. The device also includes a p-type ESD region 203 between the collector region 202 and the base region 208, and isolation regions 216.

The n-type collector 202 and the n-type emitter 204 are preferably made from an n-type source/drain implant. Typically, the collector 202 and emitter 204 have the same doping because the collector 202 and emitter 204 can be implanted at the same mask and processing step. For example, typically Arsenic ions can be implanted with a dose of about $1 \times 10^{14}$ cm$^{-2}$ to about $5 \times 10^{15}$ cm$^{-2}$ and an implant energy between about 10 keV and about 50 keV. In other embodiments, other materials, such as Phosphorus or Germanium, can be implanted. The resulting doping concentration for the n-type collector 202 is typically greater than $10^{20}$ cm$^{-3}$.

The p-type base contact region 206 on the other hand is preferably made from a p-type source/drain implant. For example, boron ions can be implanted with a dose of about $5 \times 10^{13}$ cm$^{-2}$ to about $5 \times 10^{15}$ cm$^{-2}$ and an implant energy between about 5 keV and about 50 keV. In other embodiments, other materials, such as BF$_2$, can be implanted. The final doping concentration for the p-type base contact region 206 is typically greater than $10^{20}$ cm$^{-3}$.

The p-type ESD region is formed by implanting, for example, Boron ions with a dose of about $1 \times 10^{13}$ cm$^{-2}$ to about $5 \times 10^{14}$ cm$^{-2}$ and an implant energy between about 20 kV and about 80 kV. In other embodiments, other materials can be implanted, such as BF$_2$ or In, which has less diffusivity for steeper profiles. The final doping concentration of the p-type ESD region is typically between $2 \times 10^{18}$ cm$^{-3}$ and $2 \times 10^{19}$ cm$^{-3}$.

A portion of the top surface of the collector 202, emitter 204 and base contact 206 regions include silicided regions 212 on top of which contacts 214 are fabricated. In FIG. 2, the silicided regions are underneath the contacts, although in other embodiments the silicided regions can overlie the entire surface of the collector 202, emitter 204 and base contact 206 regions. Silicide blocking over those parts of these regions that are not underneath the contacts is desireable because it makes the device more robust with respect to ESD performance.

In a preferred embodiment of the present invention, the collector 202 is coupled to a node to be protected 106, the base 208 is coupled to the SCR 101 (FIG. 1a), and the emitter 204 is coupled to reference node 108. The NPN triggering element 202 produces a snapback trigger current $I_{t1}$ 109 when the collector-base junction voltage exceeds the snapback trigger voltage ($V_{t1}$). $V_{t1}$ for NPN devices typically range from 9V to 15V in state of the art submicron processes. Unfortunately, this range of voltages exceeds the desirable trigger voltage for most ESD applications. By adding an additional layer of p doping 203 between at least a portion of the collector 202 and the base 208, the $V_{t1}$ for the device is reduced to a range of 5V to 9V. The reduction in breakdown voltage is accomplished because the depletion region formed at the junction of p-type ESD implant 203 and the n-type collector 202 is thinner than a depletion region that would be formed between the p-well base 208 and n-type collector 202 if the p-type ESD implant 203 was not present. Additionally, the electric field across the depletion region when ESD implant 203 is present will be higher for the same applied voltage than if the ESD implant 203 was not present.

Figure 3A:
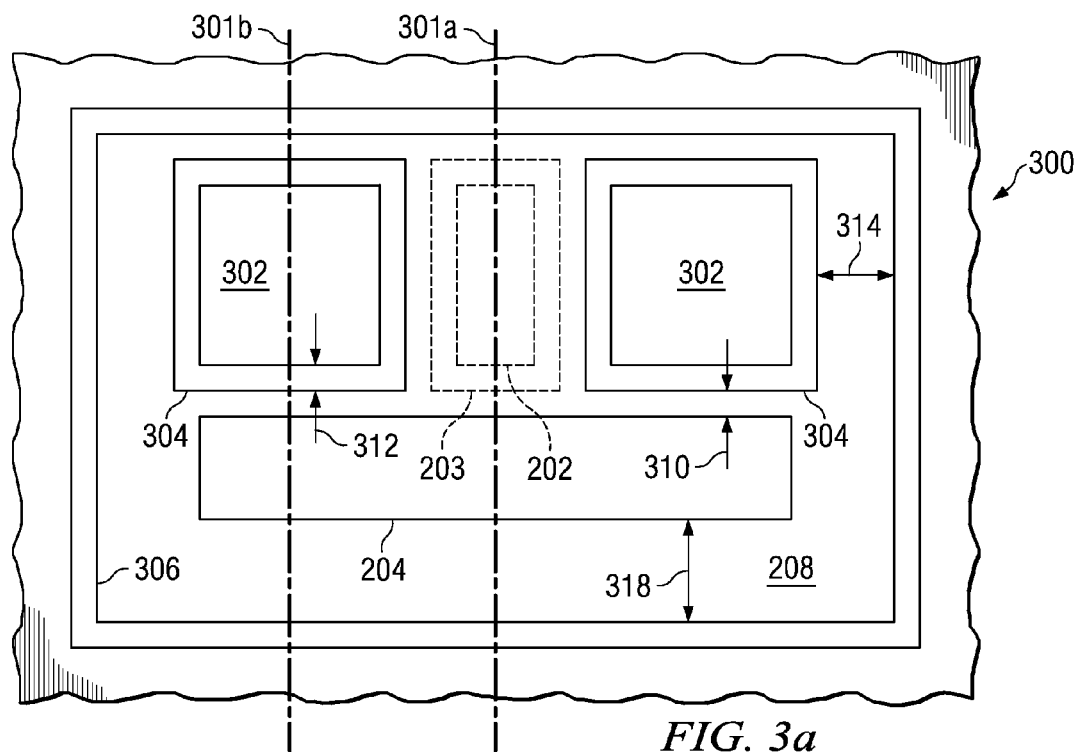
FIGS. 3a-3d are layout views of embodiments of the present invention.

FIG. 3a illustrates a layout view of an embodiment of the present invention. In the figure, the trigger element 104 (FIG. 1) and the SCR element 104 (FIG. 1) are combined in the layout. N-type region 204 functions as both the emitter of the NPN trigger element and the cathode of the SCR device, p-well region 310 functions as both the base of the NPN trigger element and the p-base node of the SCR, n-well region 304 functions as the n-base node of the SCR device, p-type region 302, which sits inside the n-well 304, functions as the p-type anode of the SCR device, and n-type region 202 functions as the collector of the NPN trigger element. The p-type ESD implant 203 is fabricated under the n-type collector region. The p-type ESD implant 203 increases the doping concentration locally and in the p-well and under the n-type collector region. An optional p-type ring 306 surrounds the ESD device and is biased at ground potential to prevent substrate charging in some embodiments, or is left floating in other embodiments. Furthermore in other embodiments, n-well 304 can be connected to a reference voltage through a resistor (124, FIG. 1b) to a reference voltage or to the power supply to adjust the trigger voltage of the ESD device. This resistor is preferably an n-well resistor.

The p-type anode 302 and the p-type ring 306 are preferably made from a p-type source/drain implant as described herein above. Alternatively, other forms of doping schemes may be used for these regions in other embodiments. It should also be noted that the embodiments of the invention described herein may also be fabricated with a reverse polarity, such as where a PNP is used to trigger the SCR device instead of the NPN device as described herein. Alternatively, embodiments of the present invention can be fabricated where the n-type regions are substituted for p-type regions, and p-type regions are substituted for n-type regions.

In a first embodiment of the present invention, the NPN trigger element collector 202 is placed in close proximity to the NPN emitter/SCR cathode region 204 and in close proximity to the SCR anode region 302. The distance 312 from the edge of the anode 302 to the edge of the n-well region 304 ranges from 50 nm to 1000 nm and is typically about 150 nm. The distance 310 from the edge of the n-well region 304 to the edge of the NPN emitter/SCR cathode region 204 ranges from 50 nm to 1000 nm and is also typically about 150 nm. The distance 314 from the edge of the n-well element 304 to the p-type substrate connection 306 is typically about 1 μm, and the distance 318 from the edge of the NPN emitter/SCR cathode region 204 to the p-type substrate connection is also typically 1 μm. The purpose of placing the NPN emitter/SCR cathode region 204 close to the p-type anode region 302 is to achieve a fast triggering SCR device.

Figure 4A:
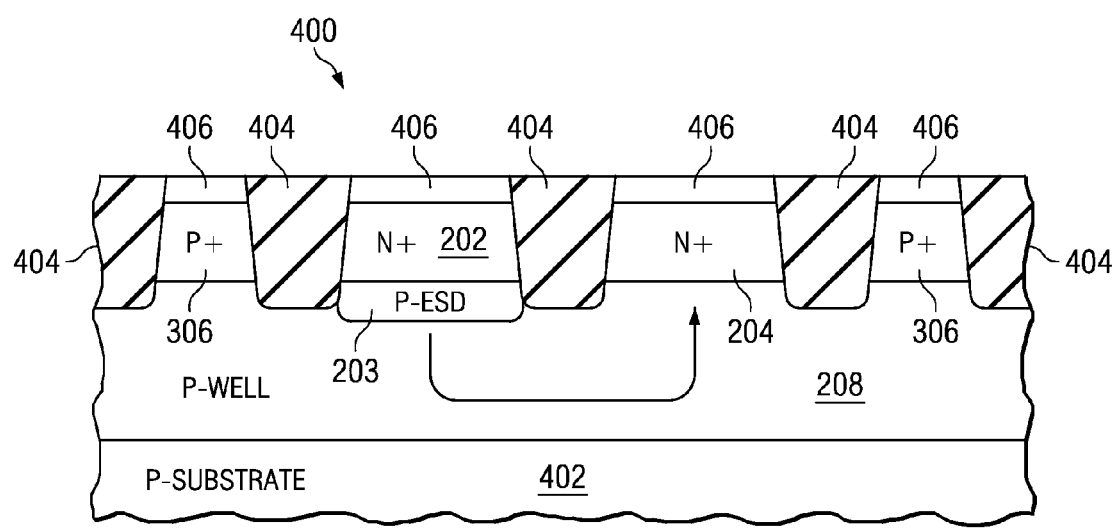
FIGS. 4a-4c are cross-sectional views of the layout view shown in FIG. 3a, and a functional schematic of the layout views shown in FIGS. 3a-3b.

FIG. 4a, containing a cross-sectional view of the layout view in FIG. 3a taken at line 301a, shows the cross section of the NPN trigger device 400. In the first embodiment of the present invention, p-well 208 is typically fabricated over a p-type substrate 402. In alternative embodiments, however, the substrate can be SOI or n-type. In a preferred embodiment of the present invention, implanted regions 306, 202, and 204 are silicided 406 to reduce contact resistance, and contacts (not shown) are fabricated over the silicided regions.

Figure 4B:
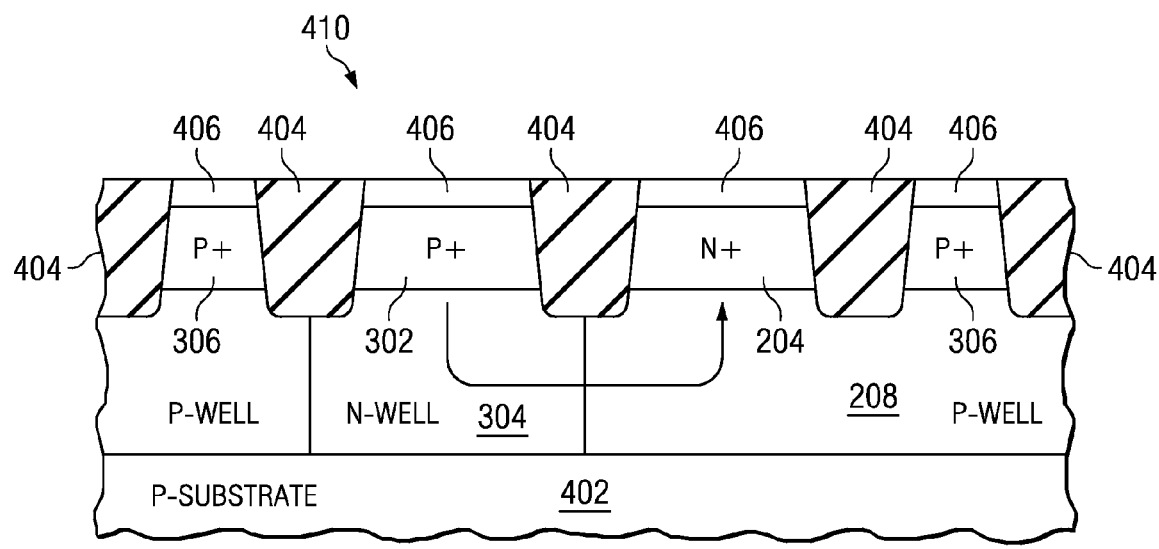

FIG. 4b, containing a cross-sectional view of FIG. 3a taken at line 301b, shows the cross section of the SCR device 410. The NPN emitter/SCR cathode 204 and the substrate ties 306 are shared with the NPN trigger region (101 in FIG. 1a) and are discussed herein above. An n-well 304 which functions as an n-type base region for the PNP (120 in FIG. 1b) or n-type base region of the SCR is fabricated adjacent to the p-well 208 and typically consists of Phosphorous with a peak concentration of typically about $1\times10^{18} cm^{-3}$. In a preferred embodiment of the present invention, the p-type anode is 302 is silicided and contacts are provided (not shown) to couple the SCR device to the circuit to be protected.

Figure 3B:
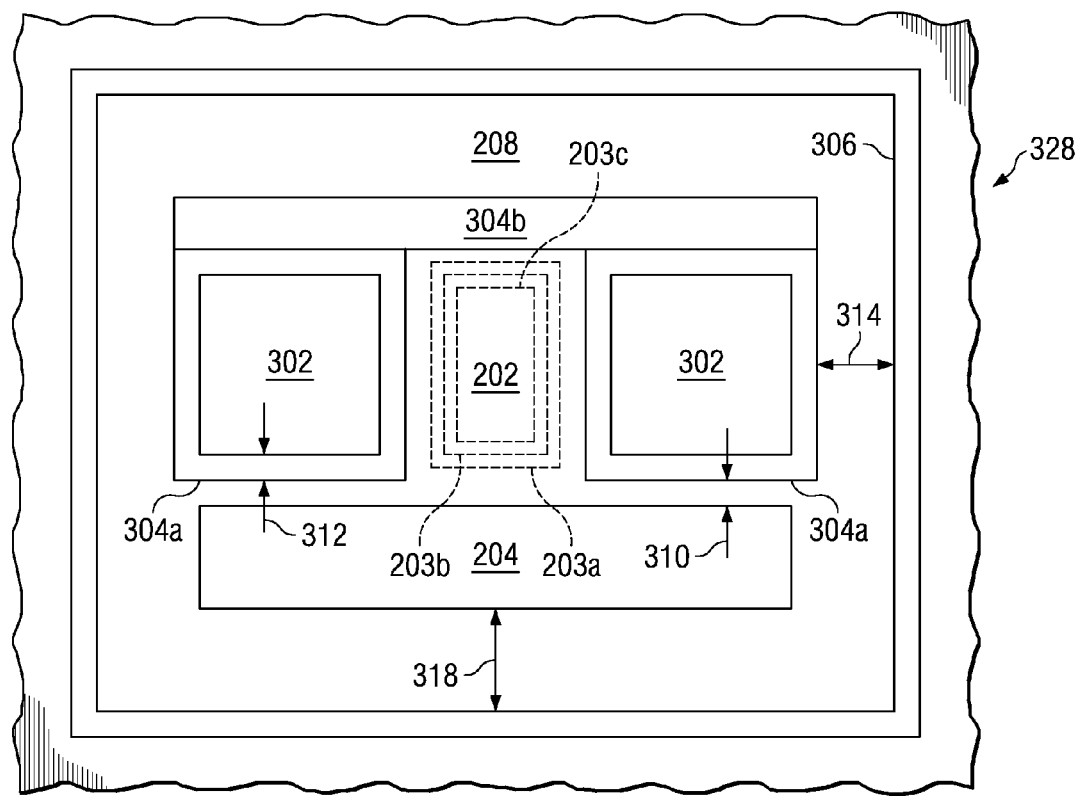

FIG. 3b shows a layout view of an alternative embodiment of the present invention in which N-well regions 304a are connected by n-well region 304b. The purpose of connecting these regions is to improve the turn-on characteristics of both halves of the device 300. As discussed earlier during the triggering of the SCR, the n-well region 304a is pulled low (assuming one half of the device only). Then the connecting n-well 304b will "transmit" this reduced potential to the other SCR half to enable the trigger region there. In some embodiments these n-well regions are connected to a supply potential (not shown). This resistive connection to the power supply takes current away from the SCR during triggering, thereby increasing the triggering voltage and triggering time. The resistive connection can, therefore, be used to fine-tune the trigger characteristics of the ESD protection device 300 in some embodiments.

In the alternative embodiment, the doped p ESD implant 203a/203b/203c fabricated under the n-type collector region can vary in size. In some embodiments, the ESD implant only covers a portion of the collector region 202 as is shown in region 203c, in some embodiments, the ESD implant is the same size as the collector region 202 as shown in region 203b, and in other embodiments, the mask for the ESD implant is drawn wider and longer than the collector region 202 as shown in region 203a. By varying the size of the ESD implants 203, junction capacitance and junction leakage current can be traded off for faster and more efficient triggering. Because the p-type ESD region 203 has a higher doping concentration than the lower doped p-type region directly beneath it, the interface between the n+collector 202 and the P-type ESD region 203 will be more capacitive and exhibit a higher junction leakage current. When the ESD region 203 is drawn to be larger than the collector region 202, for example, region 203c, and when the ESD implant 203 is shallower than shallow trench isolation (STI), the resulting ESD region 203 is substantially the same size as the collector region 202 because the ESD implant becomes self-aligned with the n+collector implant.

Figure 4C:
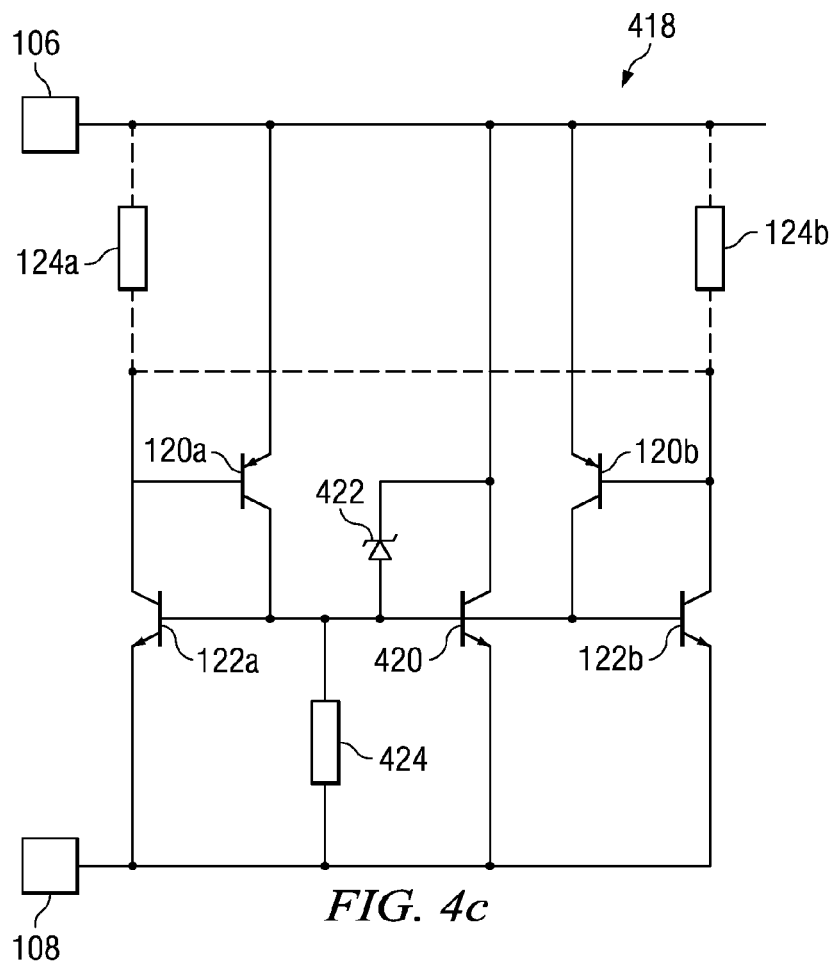

FIG. 4c shows an equivalent functional schematic representation of the alternate embodiment of the present invention. The SCR devices of each half of the ESD device are represented by bipolar latches made up of NPN devices 122a and 122b, and PNP devices 120a and 120b. N-well connections to the node to be protected are represented by the dotted lines. The trigger device is represented by NPN device 420, and the zener diode 422 placed between the base and the collector of NPN 420. The zener diode symbol 422 signifies that device 420 will break down at a certain voltage. There is no separate zener diode in the circuit, however. Resistor 424 represents the substrate resistance from the p-type base to the SCR ground 108. The node to be protected 106 is shown connected to the SCR anode and collector of the trigger NPN 420, and the n-well resistance 124a/124b.

Figure 3C:
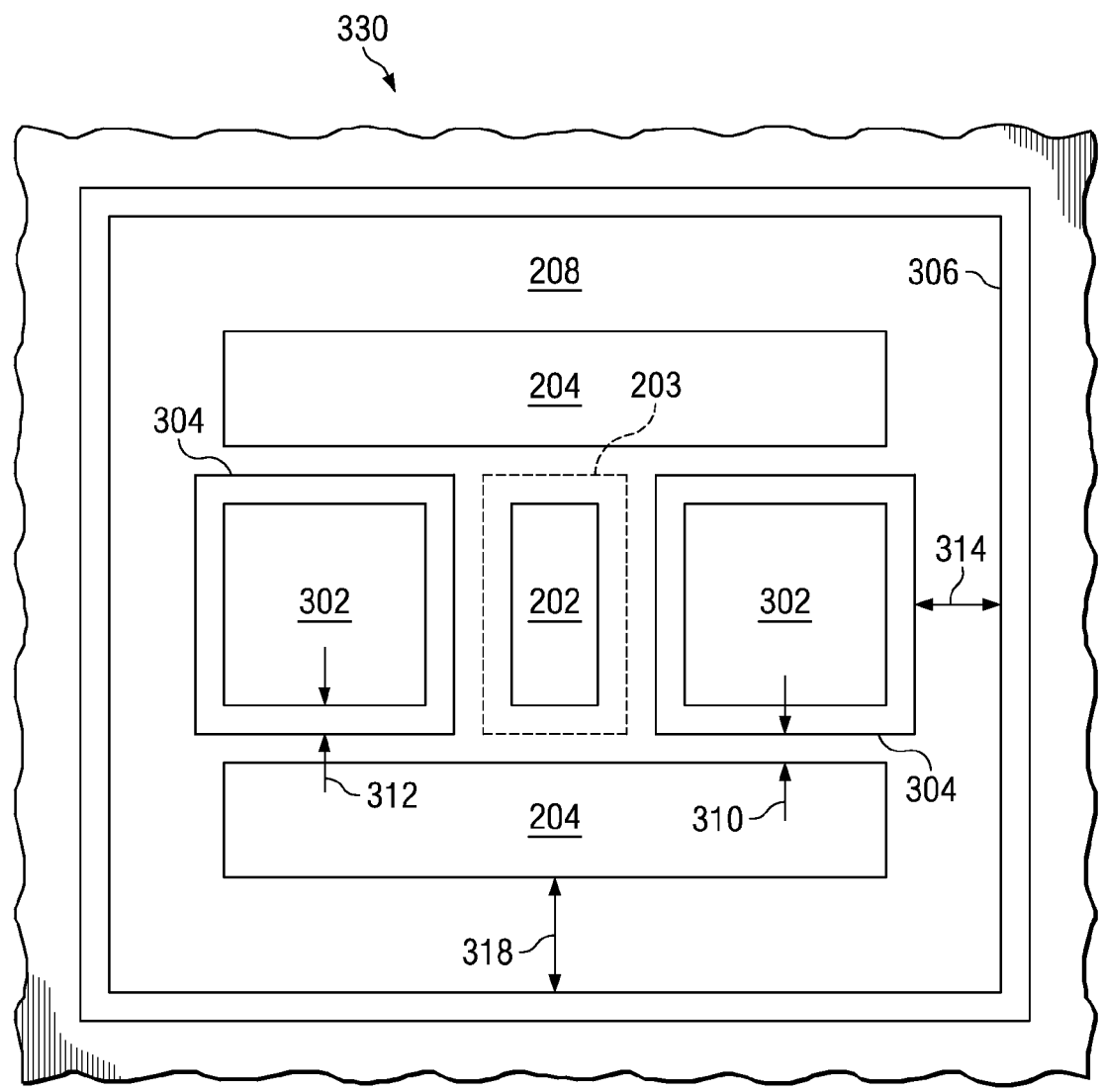

FIG. 3c shows a layout view of a second alternative embodiment of the present invention which is a fully symmetrical version of the embodiment shown in FIG. 3a. In the alternative embodiment, an additional NPN emitter/SCR cathode 204 region is placed above the NPN collector 202, the SCR anode 302, and the SCR n-well n-base region 304. Adding the additional NPN emitter/SCR cathode 204 region creates a more efficient ESD device by making trigger current injection more efficient because less trigger current and ESD current is injected into the substrate.

Figure 3D:
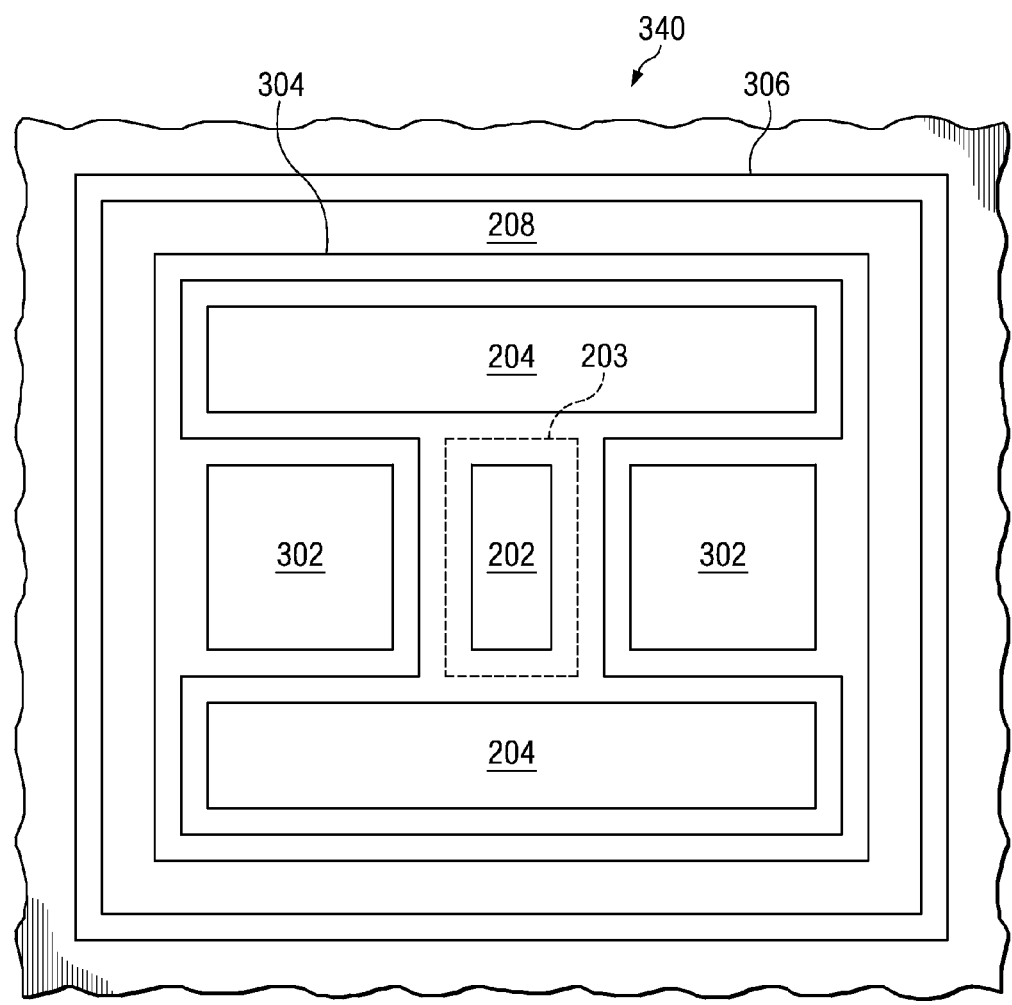

FIG. 3d shows a layout view of a third alternative embodiment of the present invention. This embodiment is similar to the embodiment shown in FIG. 3b with the addition of an n-well ring 304 around the active regions of the ESD device 340. The closed n-well ring 304 allows for better coupling and for more efficient substrate pumping. During the triggering of the SCR, the p-substrate or p-well (i.e. base region of the NPN) increases its potential because the PNP turns on. This increase in potential is also called "pumping." The more uniformly the substrate is pumped, the faster and more uniformly the protection device turns on. The n-well ring 304 increases the effective substrate resistance for the best possible confinement of the injected carriers during triggering. By confining carriers, the ESD device will trigger faster because more charge is available to trigger the SCR and less charge is lost into the substrate.

One advantage of one or more embodiments described herein above includes a low trigger voltage during an ESD event. In various embodiments of the present invention, it is possible to achieve trigger voltages as low as 5V. Another advantage of one or more of the embodiments described herein is the low capacitance of the SCR while it is in its non-conducting state. This structure generally has lower capacitance than other ESD structures because the device is very compact and area efficient. A further advantage of one or more embodiments described herein is the relatively small and compact size of these ESD devices. First, layout area is conserved because there are no routing lines required between the trigger element and the SCR. Second, because SCRs can handle a higher amount of current per unit area, the total required layout area-will typically be smaller than ESD protection devices that use MOS devices either as the triggering circuit or as the ESD device itself.

Figure 5A:
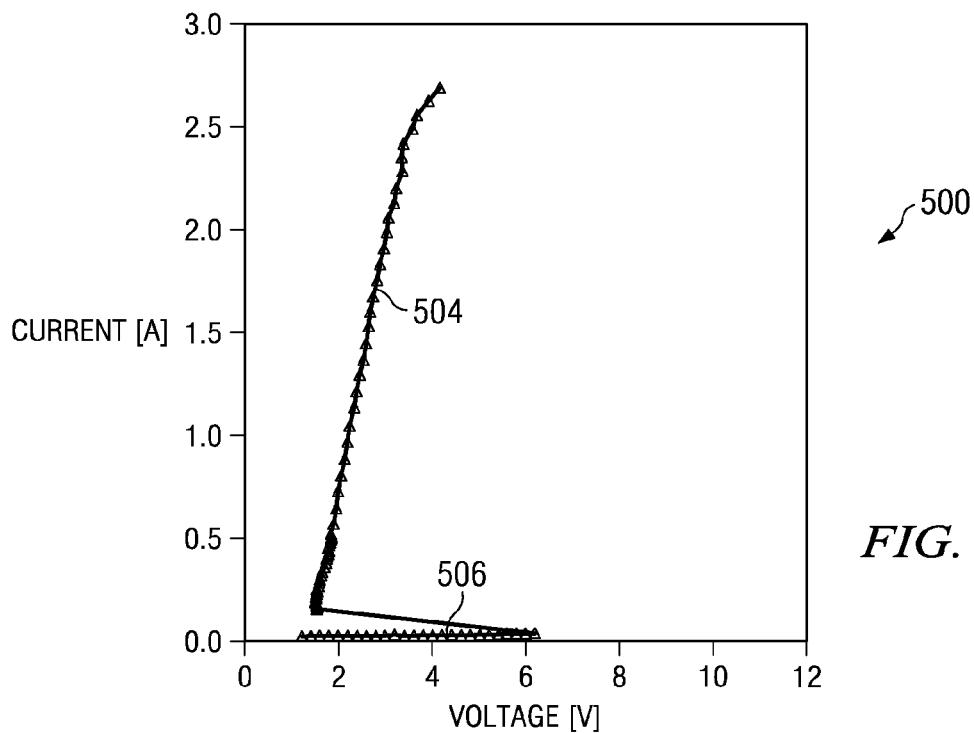
FIGS. 5a-5b are graphs showing the current vs. voltage characteristic of an embodiment of the present invention.
Figure 5B:
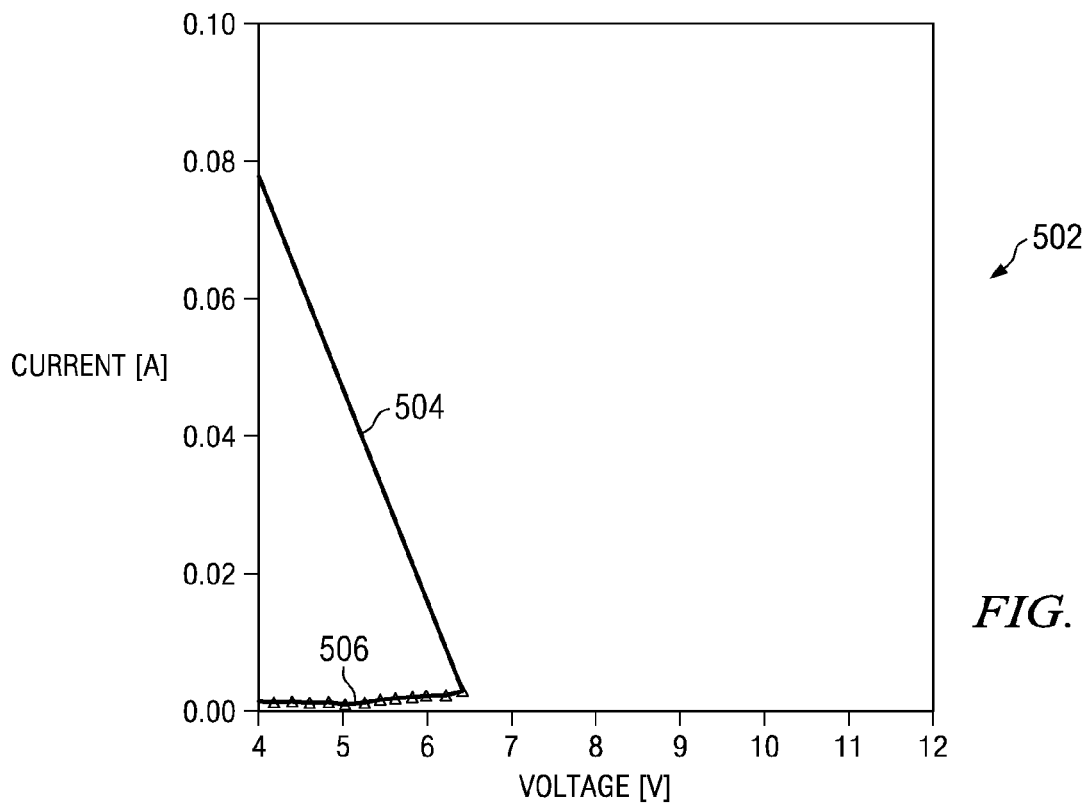

A performance graph 500 is shown in FIG. 5a for an embodiment of the present invention. The x-axis represents the voltage at the node to be protected 106 (FIG. 1), and the y axis represents the resulting current, $I_{ESD}$ 107, conducted by the ESD device. A typical trigger voltage 506 for an embodiment of the present invention is 6.4V. A typical maximum current for $I_{ESD}$ 107 is 52 μA/μm given a 100 ns transmission line pulse (TLP). A magnified view 502 of the performance graph is shown in FIG. 5b.

Figure 6:
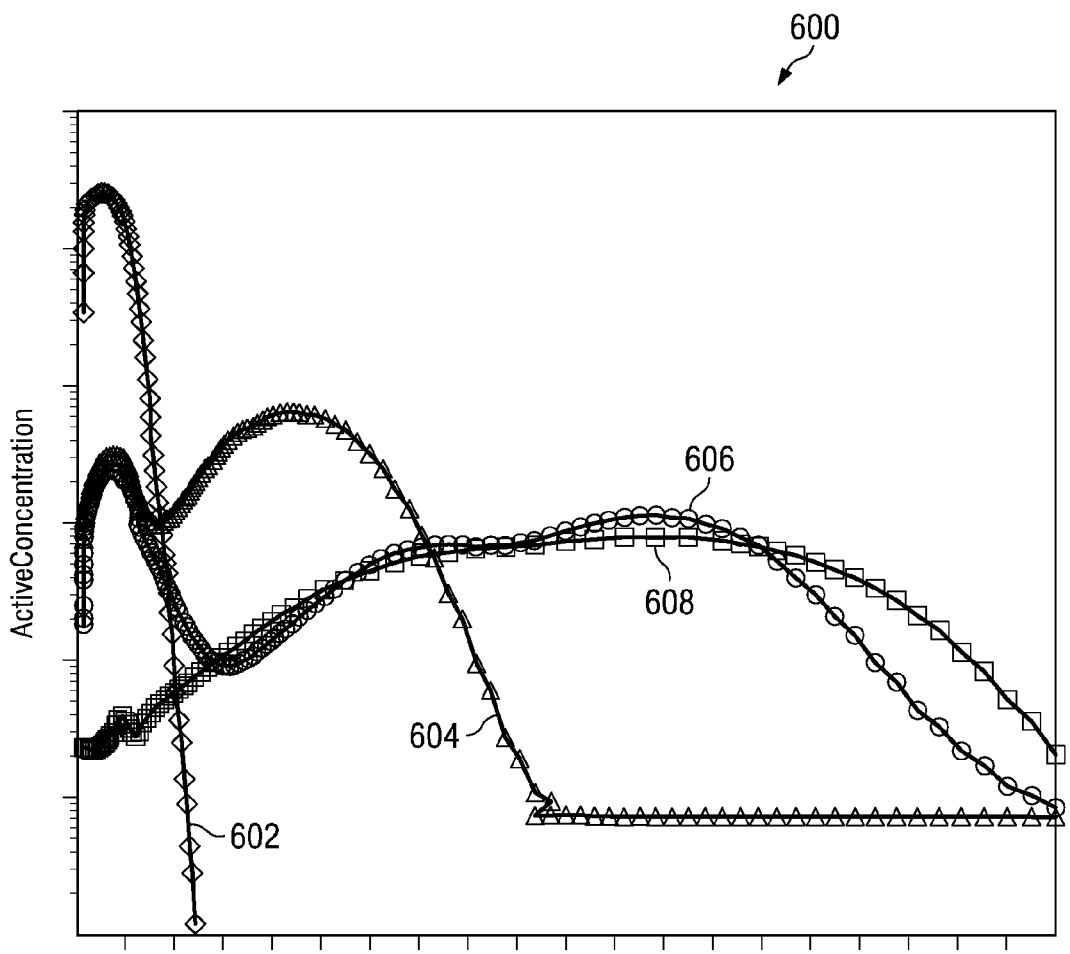
FIG. 6 is a graph showing the relative doping profile of an embodiment of the present invention.

FIG. 6 shows a plot 600 of relative doping concentration versus depth from the surface of the silicon. Line 602 represents the concentration of the n+ source/drain implants used for the anode and the cathode, line 604 represents the doping concentration of the p-type ESD implant under the NPN trigger device collector, line 606 represents the p-well doping concentration, and line 608 represents the n-well doping concentration. In these embodiments, the n-well and p-well regions are typically exclusively used (i.e. not overlapping). The implant conditions for all doped regions, as described herein, will determine the actual doping concentrations, and the ratio of the two concentrations will determine the breakdown voltage.

Figure 7A:
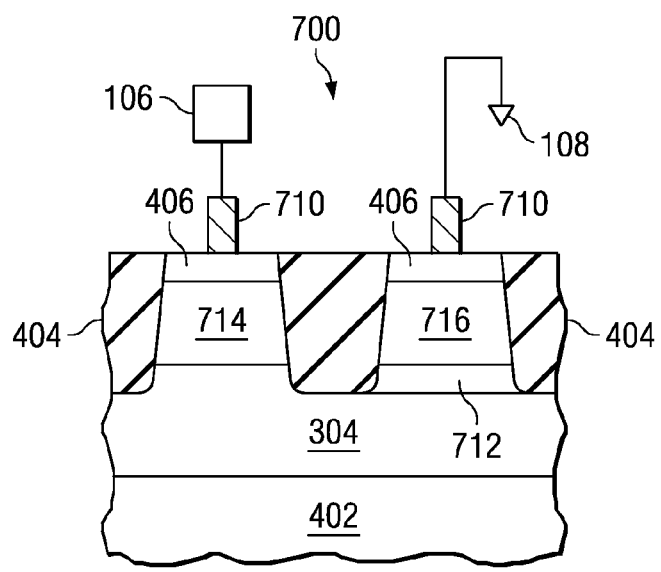
FIGS. 7a-7d are cross-sectional views of an alternative embodiments of the present invention.

Turning to FIG. 7a, an alternative embodiment of the present invention is shown. Rather than having a lateral NPN triggering device as described herein above, a vertical NPN device is used and is merged with the SCR in a layout. In an alternative embodiment of the present invention, an n-well 304 is formed above the substrate 402. As was the case in other embodiments, a p-type anode 714 is formed over the n-well. In this embodiment, however, an n-type cathode 716 is formed over a p-type ESD region 712. Cathode 716, p-type ESD region 712 and the n-well 304 form a vertical NPN transistor. The top surface of the anode 714 and cathode 716 are silicided and contacts are placed over the silicided regions. The node to be protected 106 is coupled to the anode 714, and the cathode 716 is typically coupled to ground 108 or a reference node. When the voltage at the node to be protected exceeds the reverse breakdown voltage of the NPN transistor determined by the concentration levels of the p ESD implant and n-well, the SCR device is triggered and current flows from the node to be protected 106 to ground 108.

Figure 7B:
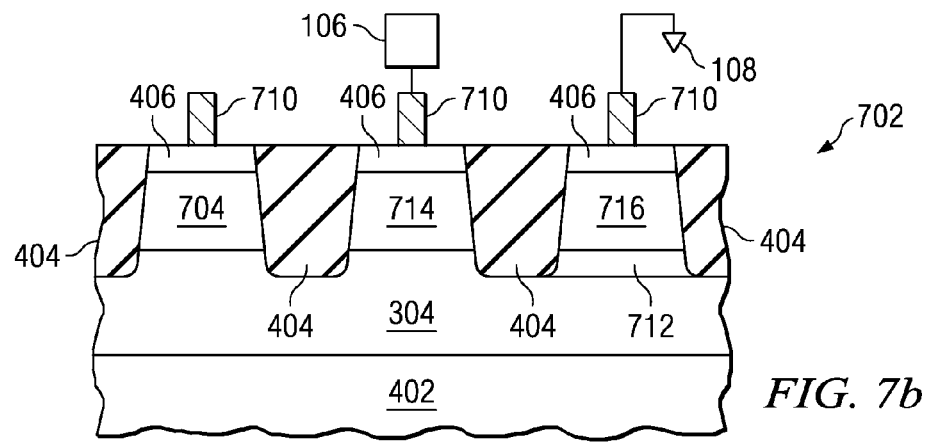

FIG. 7b shows a cross-section of an alternative embodiment of the cross-section shown in FIG. 7a. In this alternative embodiment, n-type trigger connection 704 is made to the n-well 304. In this embodiment, an external trigger current may be used to trigger the device, if needed. N-well connection 714 is a highly doped-n+ region, and an n-type source/drain diffusion is used. The top surface of the n-well connection is typically silicided and a contact 710 is placed over the silicided region 406. The trigger connection 704 is coupled to a triggering device and preferably triggers at a trigger voltage of less than the breakdown voltage of the NPN transistor formed by the n-well 204, ESD region 712 and cathode 716.

Figure 7C:
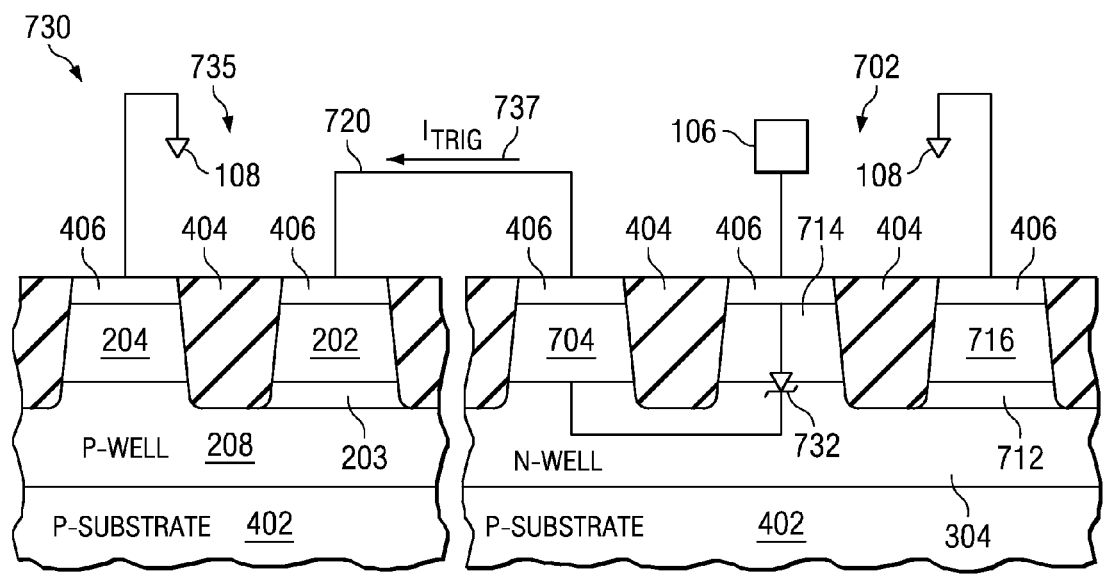

For example, in one embodiment, the trigger connection 704 can be connected to an NPN trigger device as shown in FIG. 7c to form an ESD protection device 730. The NPN trigger device 735 shown in the left side of FIG. 7c is similar to the NPN device shown in FIG. 2. An n+ collector 202 overlies a p-type ESD region 203. The p-type ESD region 203 in series with a p-well 208, form the base of the transistor. An n+ emitter 204 is connected to ground, while the collector 202 is connected via a metal or other connection to the trigger connection 704. During an ESD event, the diode junction 732 formed between the SCR anode 714 and the SCR n-base region 304 is forward biased and is in series with the collector 202 of the NPN trigger device 735. When the voltage at the collector 202 of the NPN trigger device 735 exceeds the snapback trigger voltage, $V_{t1}$, current $I_{TRIG}$ 737 conducts, and the SCR device 702 is triggered as described herein above.

Figure 7D:
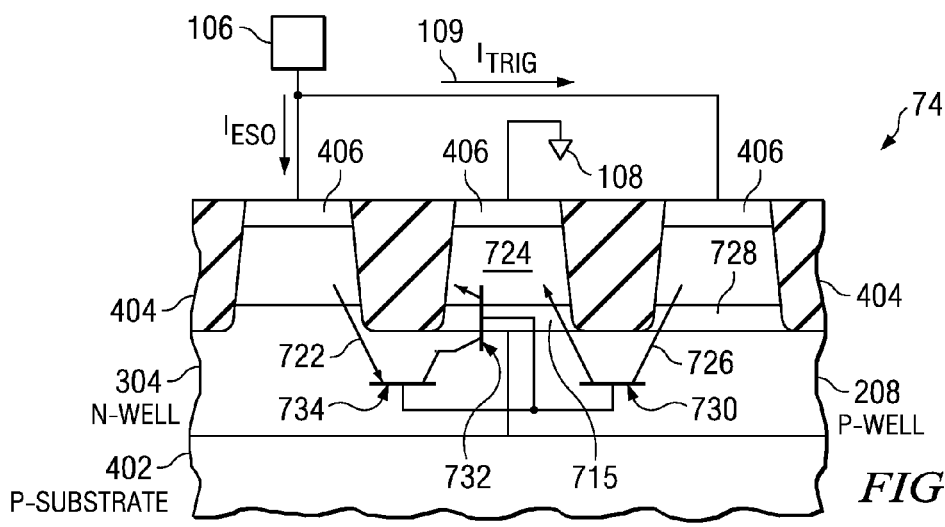

In another embodiment of the present invention, shown in FIG. 7d, the SCR device 700 of FIG. 7a is merged together with a trigger NPN device 730. The trigger NPN device, as represented by the schematic symbol in FIG. 7d, has an n+ collector 726 overlying a p-type ESD layer 728. N+ collector region 726 is similar to region 202 shown in FIG. 7c, and p-type ESD layer 728 is similar to region 203 shown in FIG. 7c. The emitter 724 of the trigger NPN device 730, shares the same n+ region as the cathode of the SCR device. The base of the NPN trigger device 730 is made from the p-type ESD region 728 under the collector 726, the p-well region 208, and an additional p-type ESD region 715 that is shared with the p-base region of the SCR device.

The SCR device is made from a p+ anode 722, an n-base region 304, a p-base region 715 made from a p-type ESD region and an n+ cathode 724. The interface between the n-well 304 and the p-well 208 is located underneath regions 715 and 724, which form the cathode of the SCR and the emitter of the trigger NPN, and the p-type ESD region which forms the p-base region of the SCR and a portion of the base of the trigger NPN. The node to be protected 106 is coupled to the SCR anode 722 and the trigger NPN collector 726. The NPN collector/SCR Cathode 724 is connected to ground.

During an ESD event, the trigger NPN device 730 breaks down and conducts trigger current $I_{TRIG}$ 109. The trigger current $I_{TRIG}$ 109 triggers the Bipolar latch represented by NPN device 732 and PNP device 734 inherent in the SCR. A large current, $I_{ESD}$, is then conducted as described herein above in the other embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   an ESD device region disposed within a semiconductor body, the semiconductor body of a first conductivity type;
   an isolation region surrounding the ESD device region;
   a first doped region of a second conductivity type disposed at a surface of the semiconductor body within the ESD device region, the second conductivity type different from the first conductivity type;
   a second doped region of the first conductivity type disposed between the semiconductor body within the ESD device region and at least a portion of the first doped region, the second doped region being doped at a higher concentration than the semiconductor body;
   a third doped region of the second semiconductor type disposed in the semiconductor body within the ESD device region;
   a fourth doped region of the first conductivity type disposed within the third doped region, wherein the edge of the third doped region is a first distance from the edge of the fourth doped region; and
   a fifth doped region of the second conductivity type disposed in the semiconductor body within the ESD device region a second distance from the third doped region,
   wherein the first doped region, second doped region, semiconductor body within the ESD device region, and fifth doped region form a trigger device; and
   wherein the fourth doped region, third doped region, semiconductor body within the ESD device region, and fifth doped region form an SCR.

2. The semiconductor device of claim 1, further comprising a sixth doped region of the first conductivity type disposed in the semiconductor body within the ESD device region a third distance away from the third doped region.

3. The semiconductor device of claim 2, wherein the first distance is between 50 nm and 1000 nm, the second distance is between 50 nm and 1000 nm, and the third distance is about 1000 nm.

4. The semiconductor device of claim 1, wherein the first conductivity type is p-type and the second conductivity type is n-type.

5. The semiconductor device of claim 4, wherein the third doped region comprises an n-well and the fifth doped region is a highly doped region.

6. The semiconductor device of claim 1, wherein the first conductivity type is n-type and the second conductivity type is p-type.

7. The semiconductor device of claim 6, wherein the third doped region comprises a p-well and the fifth doped region is a highly doped region.

8. The semiconductor device of claim 1, wherein the third doped region comprises a plurality of third doped regions, and wherein a fourth doped region of the first conductivity type is disposed on each of the third doped regions.

9. The semiconductor device of claim 8, wherein a sixth region of the second conductivity type connects at least two of the third doped regions together.

10. The semiconductor device of claim 9, wherein the sixth region has the same doping concentration as the third doped regions.

11. The semiconductor device of claim 8, wherein the fifth doped region comprises a plurality of fifth doped regions, and wherein the plurality of third doped regions and fifth doped regions are disposed symmetrically around the first doped region.

12. The semiconductor device of claim 11, the semiconductor device further comprising a sixth doped region of the second conductivity type disposed at the surface of the active region, the sixth doped region forming a ring around the first, third, and fifth regions, wherein the sixth region contacts the third doped regions, and wherein the sixth doped region has the same doping concentration as the third doped regions.

13. The semiconductor device of claim 1, wherein the first doped region comprises an ESD protection device, and wherein the fourth doped region is coupled to a circuit being protected, the first doped region being coupled to the circuit being protected, and the fifth doped region is coupled to a first reference potential.

14. The semiconductor device of claim 13, wherein the third doped region is resistively coupled to a second reference potential.

15. The semiconductor device of claim 14, wherein the first reference potential is ground, the second reference potential is at a voltage different from ground, the first conductivity type is p-type and the second conductivity type is n-type.

16. The semiconductor device of claim 1, wherein the first, fourth, and fifth doped regions further comprise a silicided region at the top surface of each region.

17. The semiconductor device of claim 1, wherein the third doped region comprises an n-well, and the remaining portions of the ESD region are formed in a p-well.

18. An ESD protection device, the ESD protection device comprising:
an SCR structure comprising,
a p-type anode region,
an n-type n-base region coupled to the anode region,
a p-type p-base region coupled to the n-type n-base region, and
an n-type cathode region coupled to the p-type p-base region; and
a BJT trigger element comprising,
an n-type collector,
a p-type ESD region coupled to the n-type collector region,
a p-type base region coupled to the SCR p-type p-base region, and wherein the doping concentration of the p-type base regions is less then the doping concentration of the ESD region, and
an n-type cathode region coupled to the p-type base.

19. The ESD protection device of claim 18, wherein:
the SCR p-type anode region comprises a p+ region;
the SCR n-type n-base region comprises an n-well;
the SCR p-type p-base region comprises a p-well;
The SCR n-type cathode region comprises an n+ region;
the BJT trigger n-type collector comprises an n+ region; and
the BJT trigger p-type base comprises a p-doped region with a concentration greater than the p-well, and the BJT trigger emitter comprises an n+ region.

20. The ESD protection device of claim 19, wherein:
the SCR n-type cathode region and the BJT trigger emitter comprise the same region,
the SCR p-type p-base region and the trigger BJT p-type material comprise the same region.

21. The ESD protection device of claim 18, wherein the SCR p-type anode region is coupled to the circuit to be protected, and the BJT trigger collector is coupled to the circuit to be protected.

22. A method of forming a semiconductor device, the method comprising:
forming an isolation region in a semiconductor body, wherein the isolation region defines an active area of a first conductivity type;
forming a first doped region within the active area, wherein the first doped region is of a second conductivity type opposite the first conductivity type;
forming a second doped region at the surface of the first doped region, wherein the second doped region is of the first conductivity type;
forming a third doped region at the surface of the first doped region, wherein the third doped region is of the first conductivity type, and wherein the third doped region has a higher doping concentration than the active area; and
forming a fourth doped region in and surrounded by the third doped region, wherein the fourth doped region is of the second conductivity type.

23. The method of claim 22, the method further comprising forming a fifth doped region at the perimeter of the active region, wherein the fifth doped region is of the first conductivity type.

24. The method of claim 22, the method further comprising forming a fifth doped region in the active region, wherein the fifth doped region is of the second conductivity type.

25. The method of claim 24, wherein:
the first doped region comprises an n-well;
the second doped region comprises a p-type implant;
the third doped region comprises p-type material;
the fourth doped region comprises an n-type implant; and
the fifth doped region comprises an n-type implant.

26. The method of claim 24, the method further comprising forming shallow trench isolation over portions of the active area not comprising the second doped region, the fourth doped region, and the fifth doped region.

27. The method of claim 24, the method further comprising forming silicide regions at the surface of the second doped region, the fourth doped region, and the fifth doped region.

28. A semiconductor device comprising:
a bipolar transistor comprising:

a first ESD device region disposed within a semiconductor body, the semiconductor body of a first conductivity type, an isolation region surrounding the first ESD device region, a first doped region of a second conductivity type disposed at a surface of the semiconductor body within the first ESD device region, the second conductivity type different from the first conductivity type, a second doped region of the second conductivity type disposed at a surface of the semiconductor body within the first ESD device region, and a third doped region of the first conductivity type disposed between the semiconductor body within the first ESD device region and at least a portion of the second doped region; and an SCR device comprising:

a second ESD device region disposed within the semiconductor body, an isolation region surrounding the second ESD device region, a fourth doped region of the second semiconductor type disposed in the semiconductor body within the second ESD device region, a fifth doped region of the second conductivity type disposed at a surface of the fourth doped region within the second ESD device region, a sixth doped region of the first conductivity type disposed between the fourth doped region within the second ESD device region and the fifth doped region, the sixth doped region being doped at a higher concentration than the semiconductor body, a seventh doped region of the first conductivity type disposed at a surface of the fourth doped region within the second ESD device region, and an eighth doped region of the second conductivity type disposed at a surface of the fourth doped region within the second ESD device region, wherein the eighth doped region in the second ESD device region is coupled to the first doped region in the first ESD device region.

29. The semiconductor device of claim 28, wherein the first doped region in the first ESD device region is coupled to ground potential, the fifth doped region in the second ESD device region is coupled to ground potential, and the seventh doped region in the second ESD device region is coupled to a node to be protected.

30. The semiconductor device of claim 28, wherein the first conductivity type is p-type and the second conductivity type is n-type.

31. The semiconductor device of claim 30, wherein the fourth doped region comprises an n-well.

32. The semiconductor device of claim 31, wherein the semiconductor body within the first ESD device region comprises a p-well.

* * * * *